US011844257B2

(12) United States Patent
Kim et al.

(10) Patent No.: US 11,844,257 B2
(45) Date of Patent: Dec. 12, 2023

(54) CAPPING LAYER FOR TANDEM STRUCTURE AND DISPLAY DEVICE HAVING THE SAME

(71) Applicant: Samsung Display Co., LTD., Yongin-si (KR)

(72) Inventors: Solji Kim, Suwon-si (KR); Jungjin Yang, Seoul (KR); Donghoon Kim, Suwon-si (KR); Jin Woo Park, Yongin-si (KR); Jinsook Bang, Hwaseong-si (KR); Seokjae Lee, Seongnam-si (KR); Sunhye Lee, Hwaseong-si (KR); Sanghoon Yim, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 46 days.

(21) Appl. No.: 17/347,851

(22) Filed: Jun. 15, 2021

(65) Prior Publication Data

US 2022/0140015 A1 May 5, 2022

(30) Foreign Application Priority Data

Oct. 30, 2020 (KR) ........................ 10-2020-0143723

(51) Int. Cl.
*H10K 59/35* (2023.01)
*H10K 50/19* (2023.01)
*H10K 50/852* (2023.01)

(52) U.S. Cl.
CPC ............. *H10K 59/35* (2023.02); *H10K 50/19* (2023.02); *H10K 50/852* (2023.02)

(58) Field of Classification Search
CPC ........ H01L 27/3206–27/3218; H01L 51/5036; H01L 51/504; H01L 51/5278
See application file for complete search history.

(56) References Cited

U.S. PATENT DOCUMENTS

2005/0242712 A1* 11/2005 Sung ...................... H10K 59/35
313/506
2011/0084291 A1* 4/2011 Jeong .................. H01L 51/5253
257/89

(Continued)

FOREIGN PATENT DOCUMENTS

KR          101405278 B1    6/2014
KR     1020170026012 A      3/2017

(Continued)

*Primary Examiner* — Daniel Whalen
(74) *Attorney, Agent, or Firm* — CANTOR COLBURN LLP

(57) ABSTRACT

A display device includes a first pixel area including a first pixel electrode and a first organic light emitting layer, a tandem pixel area including a tandem pixel electrode, a first tandem organic light emitting layer and a second tandem organic light emitting layer, a capping layer including a first capping layer corresponding to the first organic light emitting layer and a tandem capping layer corresponding to both the first tandem organic light emitting layer and the second tandem organic light emitting layer, and a common electrode between the first capping layer and the first organic light emitting layer and between the tandem capping layer and the second tandem organic light emitting layer. Each of the first capping layer and the tandem capping layer has a thickness, and the thickness of the tandem capping layer is smaller than the thickness of the first capping layer.

18 Claims, 10 Drawing Sheets

(56) References Cited

U.S. PATENT DOCUMENTS

| | | | | |
|---|---|---|---|---|
| 2015/0155519 A1* | 6/2015 | Lee | ........................ | H10K 59/32 |
| | | | | 257/40 |
| 2021/0074945 A1* | 3/2021 | Kim | .................... | H01L 51/5036 |
| 2022/0123061 A1* | 4/2022 | Lee | ...................... | H10K 50/852 |

FOREIGN PATENT DOCUMENTS

| KR | 1020190136692 A | 12/2019 |
|---|---|---|
| KR | 102131965 B1 | 7/2020 |

\* cited by examiner

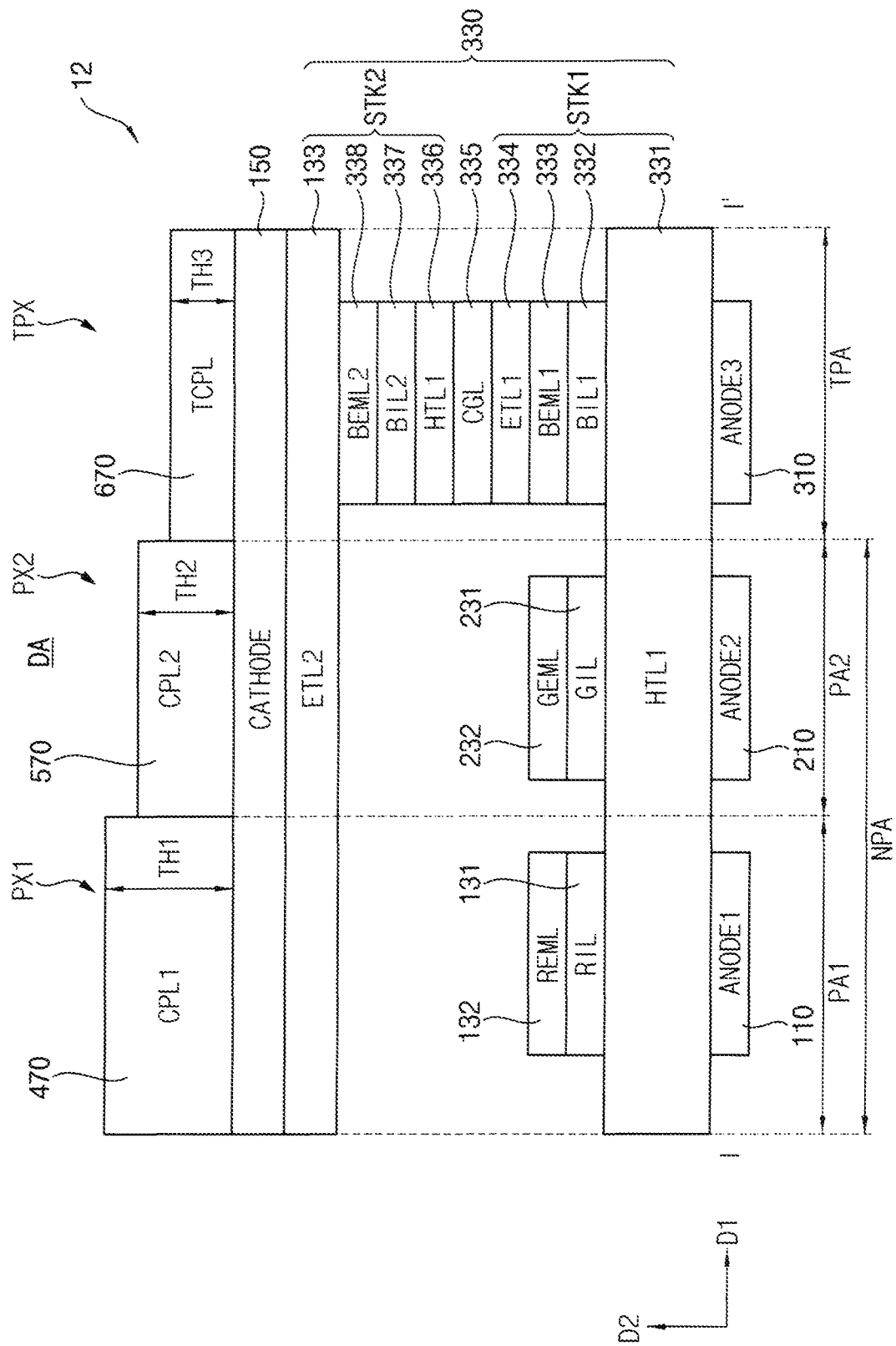

CAPPING LAYER FOR TANDEM STRUCTURE AND DISPLAY DEVICE HAVING THE SAME

This application claims priority to Korean Patent Application No. 10-2020-0143723 filed on Oct. 30, 2020, and all the benefits accruing therefrom under 35 U.S.C. § 119, the entire disclosure of which is incorporated herein by reference.

BACKGROUND

1. Field

The disclosure relates generally to a display device. More particularly, the disclosure relates to a display device including a capping layer.

2. Description of the Related Art

A display device includes light emitting diodes, and each of the light emitting diodes includes a pixel electrode, a common electrode, and an organic light emitting layer disposed between the pixel electrode and the common electrode. In order to improve an electrical current efficiency of the light emitting diode, functional layers (e.g., a hole transfer layer, an electron transfer layer, an auxiliary layer, etc.) may be further disposed above and below the organic light emitting layer. However, in consideration of manufacturing cost, process economy and yield, the functional layers are disposed only in some light emitting diodes.

SUMMARY

Embodiments provide a display device with improved display quality.

An embodiment of a display device includes a substrate including a normal pixel area and a tandem pixel area adjacent to the normal pixel area in a first direction, a first pixel electrode on the substrate and overlapping the normal pixel area, a tandem pixel electrode in a same layer as the first pixel electrode and overlapping the tandem pixel area, a first organic light emitting layer on the first pixel electrode, overlapping the normal pixel area and emitting emit light having a first color, a first tandem organic light emitting layer on the tandem pixel electrode, overlapping the tandem pixel area and emitting light having a second color different from the first color, a second tandem organic light emitting layer on the first tandem organic light emitting layer, overlapping the tandem pixel area and emitting light having the second color, a common electrode on the second tandem organic light emitting layer and overlapping the normal pixel area and the tandem pixel area, a first capping layer on the common electrode and overlapping the normal pixel area, and a tandem capping layer on the common electrode and overlapping the tandem pixel area. A thickness of the tandem capping layer in a second direction crossing the first direction may be smaller than a thickness of the first capping layer in the second direction.

According to an embodiment, the first capping layer and the tandem capping layer may include a same material.

According to an embodiment, the first capping layer and the tandem capping layer may include an organic material.

According to an embodiment, the display device may further include a first hole transfer layer on the tandem pixel electrode and overlapping the normal pixel area, and the tandem pixel area and a second hole transfer layer between the first tandem organic light emitting layer and the second tandem organic light emitting layer and overlapping the tandem pixel area.

According to an embodiment, the display device may further include a first electron transfer layer between the first tandem organic light emitting layer and the second hole transfer layer and overlapping the tandem pixel area, and a second electron transfer layer on the second tandem organic light emitting layer and overlapping the normal pixel area and the tandem pixel area.

According to an embodiment, the display device may further include a charge generation layer between the first electron transfer layer and the second hole transfer layer and overlapping the tandem pixel area.

According to an embodiment, the second hole transfer layer, the first electron transfer layer and the charge generation layer may not overlap the normal pixel area.

According to an embodiment, the display device may further include a first inorganic film on the tandem capping layer and overlapping the normal pixel area and the tandem pixel area, an organic film on the first inorganic film, and a second inorganic film on the organic film.

According to an embodiment, the first inorganic film and the second inorganic film may include at least one of silicon oxide, silicon nitride and silicon oxynitride.

According to an embodiment, the display device may further include a second pixel electrode in a same layer as the first pixel electrode and overlapping the normal pixel area, a second organic light emitting layer on the second pixel electrode, overlapping the normal pixel area and emitting light having a third color different from the first color and the second color, and a second capping layer on the common electrode and overlapping the second organic light emitting layer.

According to an embodiment, a thickness of the first capping layer in the second direction may be a same as a thickness of the second capping layer in the second direction.

According to an embodiment, a thickness of the first capping layer in the second direction, a thickness of the second capping layer in the second direction and a thickness of the tandem capping layer in the second direction may be different from each other.

According to an embodiment, each of thicknesses of the first capping layer and the second capping layer in the second direction may be greater than a thickness of the tandem capping layer in the second direction.

According to an embodiment, the first color may be red, the second color may be blue and the third color may be green.

An embodiment of a display device includes a plurality of first emitting diodes, a plurality of tandem emitting diodes adjacent to the first emitting diodes, and a capping layer on the first emitting diodes and the tandem emitting diodes. Each of the first emitting diodes may include a first pixel electrode, a first hole transfer layer on the first pixel electrode, and a first organic light emitting layer on the first hole transfer layer. Each of the plurality of the tandem emitting diodes may include a tandem pixel electrode, the first hole transfer layer on the tandem pixel electrode, a first tandem organic light emitting layer on the first hole transfer layer, a first electron transfer layer on the first tandem organic light emitting layer, a second hole transfer layer on the first electron transfer layer, and a second tandem organic light emitting layer on the second hole transfer layer. A thickness of the capping layer overlapping the tandem emitting diodes may be smaller than a thickness of the capping layer overlapping the first emitting diodes.

According to an embodiment, the display device may further include a plurality of second emitting diodes adjacent to the first emitting diodes and including a second pixel electrode, the first hole transfer layer and the second organic light emitting layer. A number of the first emitting diodes, a number of the second emitting diodes and a number of the tandem emitting diodes may be the same.

According to an embodiment, a thickness of the capping layer overlapping the tandem emitting diodes may be smaller than a thickness of the capping layer overlapping the first emitting diodes and may be smaller than a thickness of the capping layer overlapping the second emitting diodes.

According to an embodiment, the thickness of the capping layer overlapping the first emitting diodes may be the same as the thickness of the capping layer overlapping the second emitting diodes.

According to an embodiment, the thickness of the capping layer overlapping the first emitting diodes and the thickness of the capping layer overlapping the second emitting diodes may be different from each other.

According to an embodiment, the first tandem organic light emitting layer may emit light having a same color as the second tandem organic light emitting layer.

Therefore, one or more embodiment of the display device may include a first emitting diode having a one-stack structure and a tandem emitting diode having a two-stack structure (e.g., tandem structure). In addition, the display device may further include a capping layer on the first emitting diode and the tandem emitting diode, and a thickness of the capping layer overlapping the first emitting diode and a thickness of the capping layer overlapping the tandem emitting diode may be adjusted to be different from each other. Accordingly, the capping layer may reduce resonance deviation that may occur between the first emitting diode and the tandem emitting diode having different structures. As the resonance deviation is reduced, a color change amount for each angle of the tandem emitting diode may be reduced. In other words, as the resonance deviation decreases, when the display device is viewed from the side, a color shift phenomenon at the side viewing angle may be improved. In addition, as the resonance deviation is reduced, the amount of white color change according to the difference in thickness of the emitting diodes may be improved. Accordingly, a process distribution for a difference in thickness between emitting diodes may be reduced. In addition, as the tandem emitting diode has the two-stack structure, the current efficiency of the tandem emitting diode may be improved.

It is to be understood that both the foregoing general description and the following detailed description are example and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure, and together with the description serve to explain the disclosure.

FIG. 9 and FIG. 10 are cross-sectional views illustrating an embodiment of a display device.

DETAILED DESCRIPTION

Figure 1:
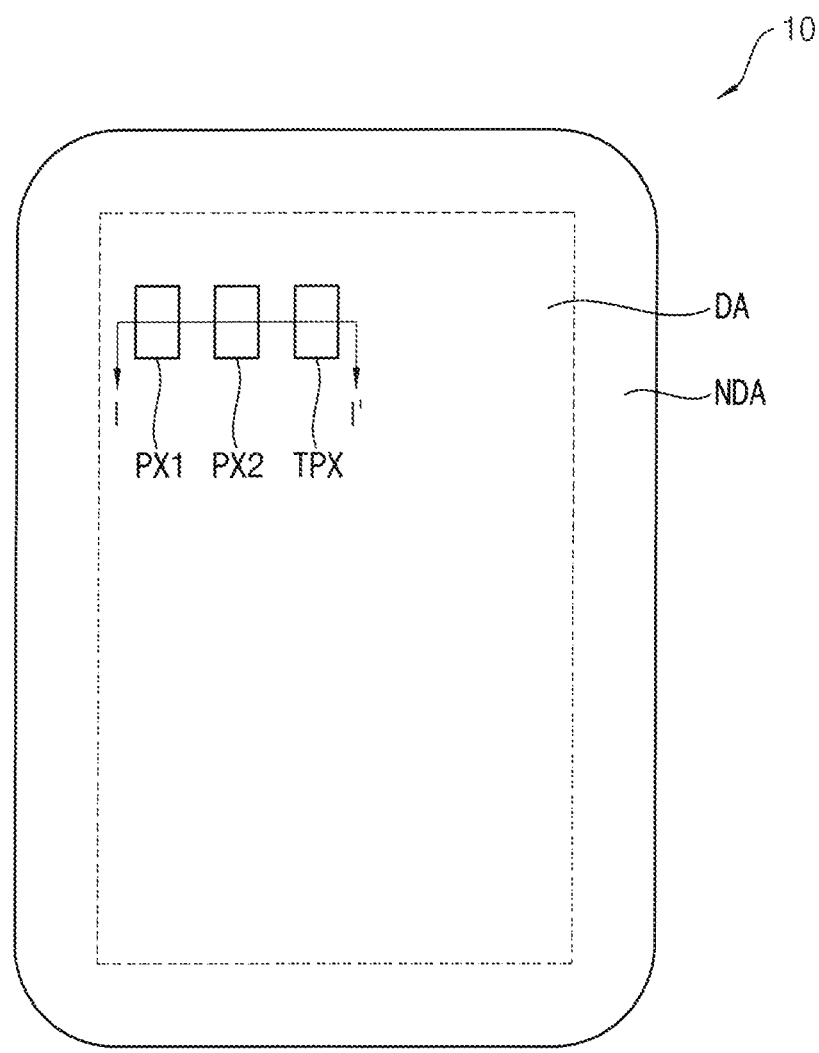
FIG. 1 is a plan view illustrating an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as "on" another element, it can be directly on the other element or intervening elements may be present therebetween. In contrast, when an element is referred to as being related to another element such as "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As functional layers are disposed only in some light emitting diodes of an electronic display device, resonance deviation between the light emitting diodes occurs. The resonance deviation increases a color change amount for each angle of the light emitting diode. In addition, the resonance deviation increases the color change amount according to the difference in thickness of the functional layers, thereby increasing process distribution. Therefore, a display device having improved display quality includes a reduction in the resonance deviation.

Illustrative, non-limiting embodiments will be more clearly understood from the following detailed description in conjunction with the accompanying drawings.

FIG. 1 is a plan view illustrating an embodiment of a display device 10.

Referring to FIG. 1, a display device 10 may include a plurality of emitting diodes (e.g., a plurality of light emitting diodes) and a plurality of tandem emitting diodes (e.g., a plurality of tandem light emitting diodes). In an embodiment, for example, the display device 10 may include a first emitting diode PX1 (e.g., first light emitting diode), a second emitting diode PX2 (e.g., a second light emitting diode) and a tandem emitting diode TPX (e.g., a tandem light emitting diode). The first emitting diode PX1, the second emitting diode PX2 and the tandem emitting diode TPX may be disposed in a display area DA of the display device 10 and may be arranged along a first direction D1. Each of the first emitting diode PX1, the second emitting diode PX2 and the tandem emitting diode TPX may be provided in plural including a plurality of first emitting diodes PX1, a plurality of second emitting diodes PX2 and a plurality of tandem emitting diodes TPX.

A thickness direction (e.g., second direction D2) of the display device 10 and components thereof may cross the first direction D1. The second direction D2 may be perpendicular to the first direction D1, without being limited thereto. The first emitting diode PX1, the second emitting diode PX2 and the tandem emitting diode TPX may be disposed in the display area DA of the display device 10 and may be arranged along a third direction crossing each of the first direction D1 and the second direction D2. The third direction may be perpendicular to the first direction D1 and/or the second direction D2, without being limited thereto.

A non-display area NDA of the display device 10 may be adjacent to the display area DA, and drivers may be disposed in the non-display area NDA. The drivers may provide an electrical signal such as a driving signal (e.g., a gate signal and a data voltage) to the first emitting diode PX1, the second emitting diode PX2 and the tandem emitting diode TPX. In an embodiment, the non-display area NDA may be positioned to surround the display area DA.

The first emitting diode PX1 may generate and/or emit light having a first color, the second emitting diode PX2 may generate and/or emit light having a second color, and the tandem emitting diode TPX may generate and/or emit light having a third color. As the light having the first color, the light having the second color and the light having the third color are combined, the display device 10 may display a desired image. In an embodiment, a number of the first emitting diodes PX1, a number of the second emitting diodes PX2 and a number of tandem emitting diodes TPX may be the same.

Figure 2:
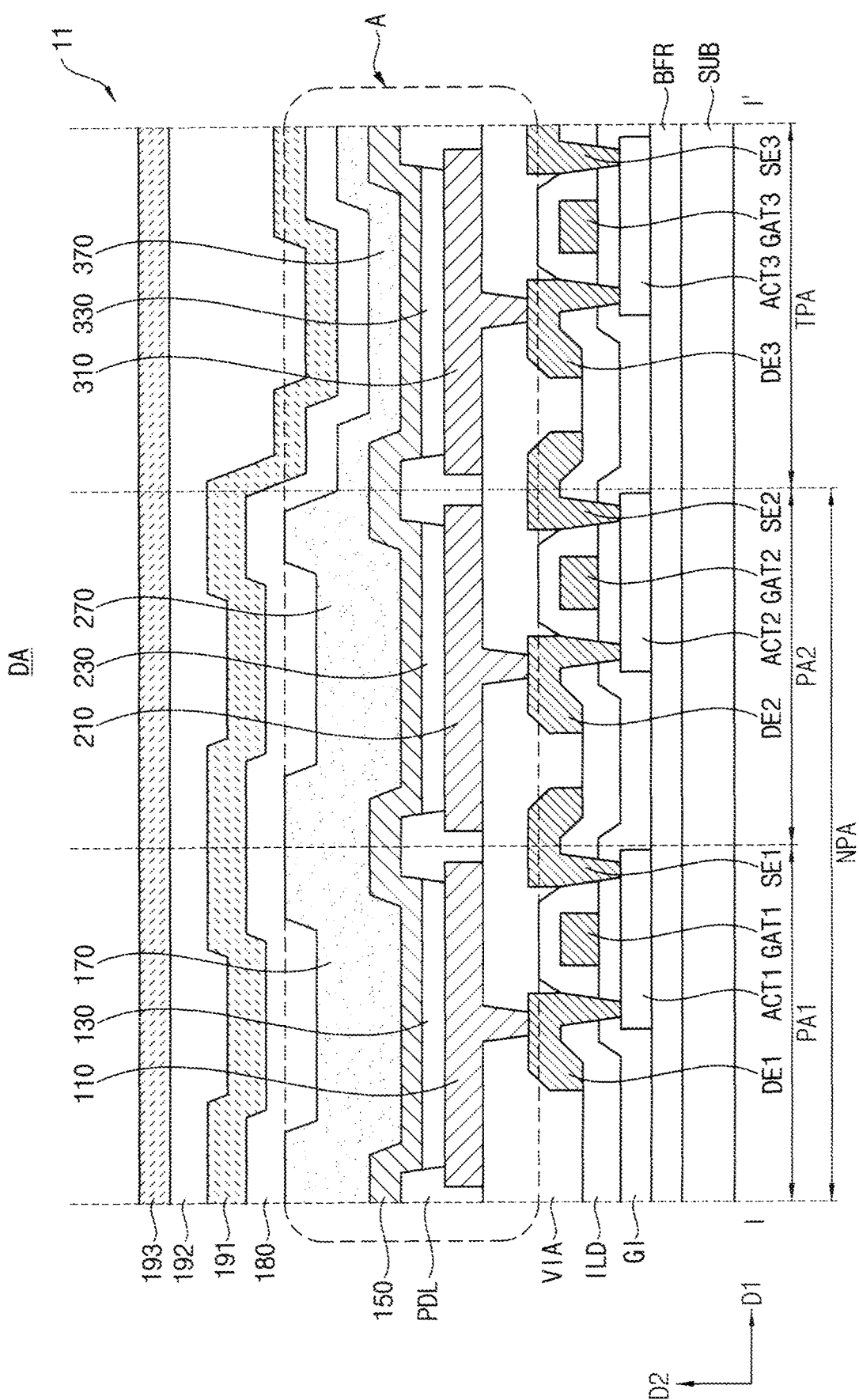
FIG. 2 is a cross-sectional view illustrating an embodiment of a display device.

FIG. 2 is a cross-sectional view illustrating an embodiment of a display device 11. In an embodiment, for example, FIG. 2 may be a cross-sectional view taken along line I-I' of FIG. 1.

Referring to FIGS. 1 and 2, a display device 11 may include a substrate SUB, a buffer layer BFR, first to third active patterns ACT1, ACT2 and ACT3, a gate insulating layer GI, first to third gate electrodes GAT1, GAT2 and GAT3, an interlayer insulating layer ILD, first to third source electrodes SE1, SE2 and SE3, first to third drain electrodes DE1, DE2 and DE3, a via insulating layer VIA, the first emitting diode PX1, the second emitting diode PX2, the tandem emitting diode TPX, a first capping layer 170, a second capping layer 270, a tandem capping layer 370, a passivation layer 180, a first inorganic layer 191, an organic layer 192 and a second inorganic layer 193.

The first emitting diode PX1 may include a first pixel electrode 110, a first emission layer 130 and a first portion of a common electrode 150, the second emitting diode PX2 may include a second pixel electrode 210, a second emission layer 230 and a second portion of the common electrode 150, and the tandem emitting diode TPX (e.g., third emitting diode) may include a tandem pixel electrode 310 (e.g., third pixel electrode), a tandem emission layer 330 (e.g., third emission layer) and a third portion of the common electrode 150.

The first pixel electrode 110, the second pixel electrode 210 and the third pixel electrode may be in a same layer as each other. As being in a same layer, elements may be respective portions or patterns of a same material layer on the substrate SUB. More than one of the pixel electrodes may together define a pixel electrode layer.

The first emitting diode PX1 and the second emitting diode PX2 may overlap or correspond to a normal pixel area NPA, and the tandem emitting diode TPX may overlap or correspond to a tandem pixel area TPA. In detail, the first emitting diode PX1 may overlap or correspond to a first pixel area PA1 of the normal pixel area NPA, and the second emitting diode PX2 may overlap or correspond to a second pixel area PA2 of the normal pixel area NPA. The first pixel area PA1, the second pixel area PA2 and the tandem pixel area TPA may be adjacent to each other in the first direction D1. That is, the first pixel area PA1, the second pixel area PA2 and the tandem pixel area TPA may in order along the first direction D1, without being limited thereto.

The substrate SUB may include glass, quartz, plastic or the like. In an embodiment, the substrate SUB may include glass, and the display device 11 may be a rigid display device. In an embodiment, the substrate SUB may include plastic such as polyimide, and the display device 11 may be a flexible display device.

The buffer layer BFR may be disposed on the substrate SUB. In an embodiment, for example, the buffer layer BFR may include silicon oxide ("SiOx"), silicon nitride ("SiNx"), silicon oxynitride ("SiON") or the like. The buffer layer BFR may reduce or effectively prevent metal atoms or impurities from diffusing into the first to third active patterns ACT1, ACT2 and ACT3. In addition, the buffer layer BFR may adjust a rate of heat provided to the first to third active patterns ACT1, ACT2 ACT3, during a crystallization process for providing or forming the first to third active patterns ACT1, ACT2 and ACT3.

The first active pattern ACT1 may be disposed on the buffer layer BFR. The first active pattern ACT1 may include a silicon semiconductor. In an embodiment, for example, the first active pattern ACT1 may include amorphous silicon, polycrystalline silicon, or the like. The second active pattern ACT2 and the third active pattern ACT3 may be disposed on the buffer layer BFR, and may include the same material as the first active pattern ACT1.

The gate insulating layer GI may be disposed on the buffer layer BFR and may cover the first to third active patterns ACT1, ACT2 and ACT3. In an embodiment, the gate insulating layer GI may include an insulating material. In an embodiment, for example, the gate insulating layer GI may include silicon oxide ("SiOx"), silicon nitride ("SiNx"), silicon oxynitride ("SiON") or the like.

The first gate electrode GAT1 may be disposed on the gate insulating layer GI. The first gate electrode GAT1 may overlap the first active pattern ACT1. In response to an electrical signal such as the gate signal provided to the first gate electrode GAT1, an electrical signal and/or a voltage may be transmitted through the first active pattern ACT1.

In an embodiment, the first gate electrode GAT1 may include a metal, an alloy, a metal oxide, a conductive material or the like. In an embodiment, for example, the first gate electrode GAT1 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

The second gate electrode GAT2 and the third gate electrode GAT3 may be disposed on the gate insulating layer GI, and may include the same material as the first gate electrode GAT1.

The interlayer insulating layer ILD may be disposed on the gate insulating layer GI and may cover the first to third gate electrodes GAT1, GAT2 and GAT3. In an embodiment, the interlayer insulating layer ILD may include an insulating material. In an embodiment, for example, the interlayer insulating layer ILD may include silicon oxide ("SiOx"), silicon nitride ("SiNx"), silicon oxynitride ("SiON") or the like.

The first source electrode SE1 may be disposed on the interlayer insulating layer ILD. The first source electrode SE1 may contact the first active pattern ACT1. In an embodiment, the first source electrode SE1 may include a metal, an alloy, a metal oxide, a conductive material or the like. In an embodiment, for example, the first source electrode SE1 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

The second source electrode SE2 and the third source electrode SE3 may be disposed on the interlayer insulating layer ILD, and may include the same material as the first source electrode SE1.

The first drain electrode DE1 may be disposed on the interlayer insulating layer ILD. The first drain electrode DE1 may contact the first active pattern ACT1. In an embodiment, for example, the data voltage may be transmitted to the first active pattern ACT1 through the first source electrode SE1, and an electrical driving current may be transmitted to the first pixel electrode 110 through the first drain electrode DE1. The first drain electrode DE1 may include the same material as the first source electrode SE1.

The second drain electrode DE2 and the third drain electrode DE3 may be disposed on the interlayer insulating layer ILD, and may include the same material as the first source electrode SE1.

A respective active pattern, a respective gate electrode, a respective source electrode and a respective drain electrode, together with a portion of the gate insulating layer GI and a portion of the interlayer insulating layer ILD, may define a transistor which is connected to a respective emitting diode, without being limited thereto.

The via insulating layer VIA may be disposed on the interlayer insulating layer ILD and may cover the source electrodes and the drain electrodes. In an embodiment, the via insulating layer VIA may include an organic insulating material. Accordingly, the via insulating layer VIA may have a substantially flat top surface. In an embodiment, for example, the via insulating layer VIA may include a photoresist, a polyacrylic resin, a polyimide resin, an acrylic resin or the like.

The first pixel electrode 110, the second pixel electrode 210, the tandem pixel electrode 310, a pixel defining layer PDL, the first emission layer 130, the second emission layer 230, the tandem emission layer 330, the common electrode 150, the first capping layer 170, the second capping layer 270 and the tandem capping layer 370 will be described with reference to FIGS. 3 and 4.

The first inorganic layer 191 may be disposed on the passivation layer 180. In an embodiment, the first inorganic layer 191 may include an inorganic material and may be disposed along a profile of the passivation layer 180. In an embodiment, for example, the first inorganic layer 191 may include silicon oxide ("SiOx"), silicon nitride ("SiNx"), silicon oxynitride ("SiON"), or the like.

The first inorganic layer 191 may reduce or effectively prevent oxygen and/or moisture from penetrating into the various emitting diodes and other layer underlying the first inorganic layer 191. Accordingly, the first inorganic layer 191 may reduce or effectively prevent deterioration of the first emitting diode PX1, the second emitting diode PX2 and the tandem emitting diode TPX. In addition, the first inorganic layer 191 may protect the first emitting diode PX1, the second emitting diode PX2 and the tandem emitting diode TPX from impact.

The organic layer 192 may be disposed on the first inorganic layer 191. In an embodiment, the organic layer 192 may include an organic material and may have a substantially flat top surface. In an embodiment, for example, the organic layer 192 may include a photoresist, a polyacrylic resin, a polyimide resin, an acrylic resin or the like. The organic layer 192 may reduce or effectively prevent propagation of cracks to other layers underlying the organic layer 192.

The second inorganic layer 193 may be disposed on the organic layer 192. The second inorganic layer 193 may face the first inorganic layer 191 with the organic layer 192 therebetween. In an embodiment, the second inorganic layer 193 may include an inorganic material. In an embodiment, for example, the second inorganic layer 193 may include silicon oxide ("SiOx"), silicon nitride ("SiNx"), silicon oxynitride ("SiON") or the like. The first inorganic layer 191, the organic layer 192 and the second inorganic layer 193 may together define an encapsulation layer.

Figure 3:
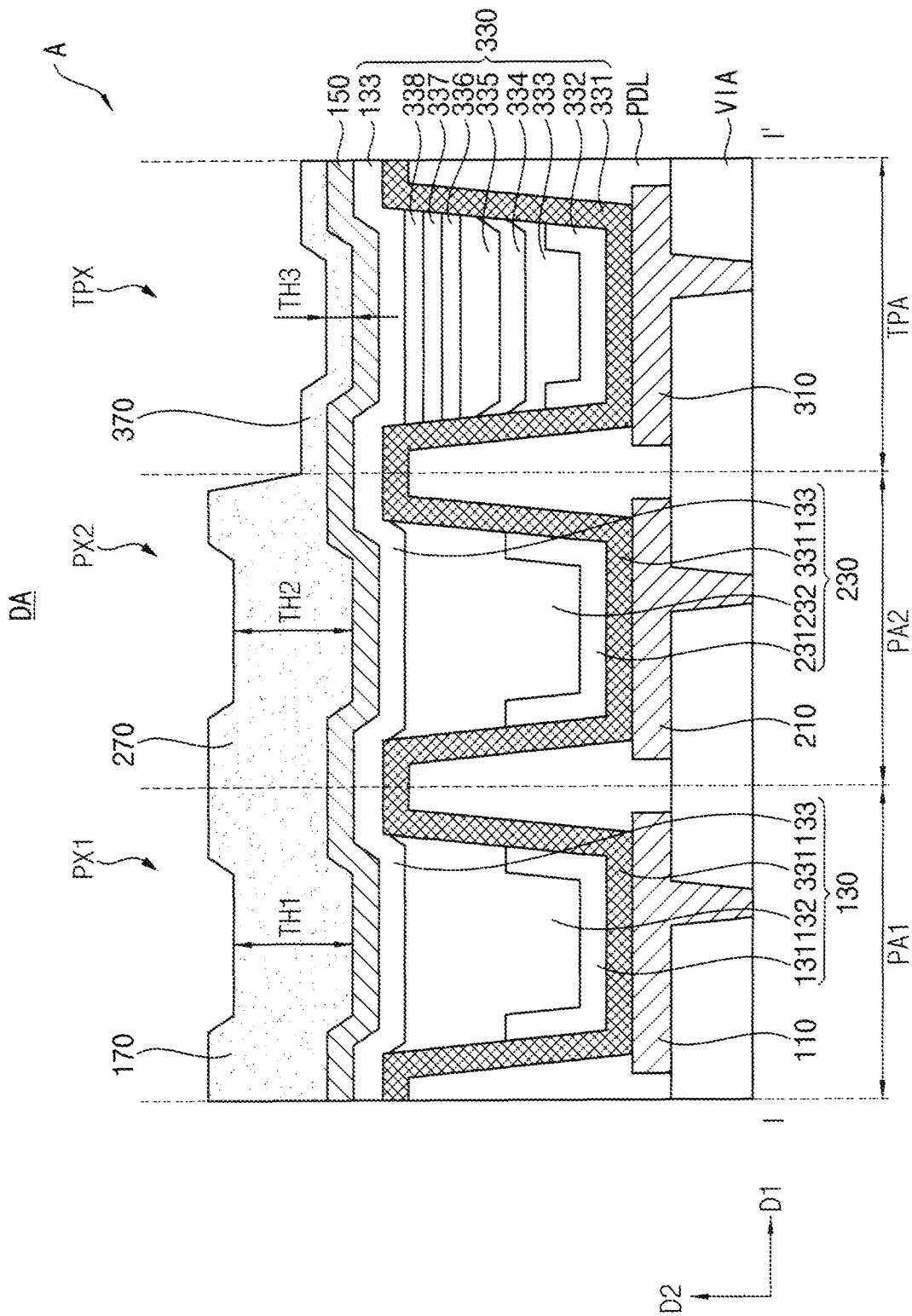
FIG. 3 and FIG. 4 are cross-sectional views illustrating an embodiment of an area A of FIG. 2.
Figure 4:
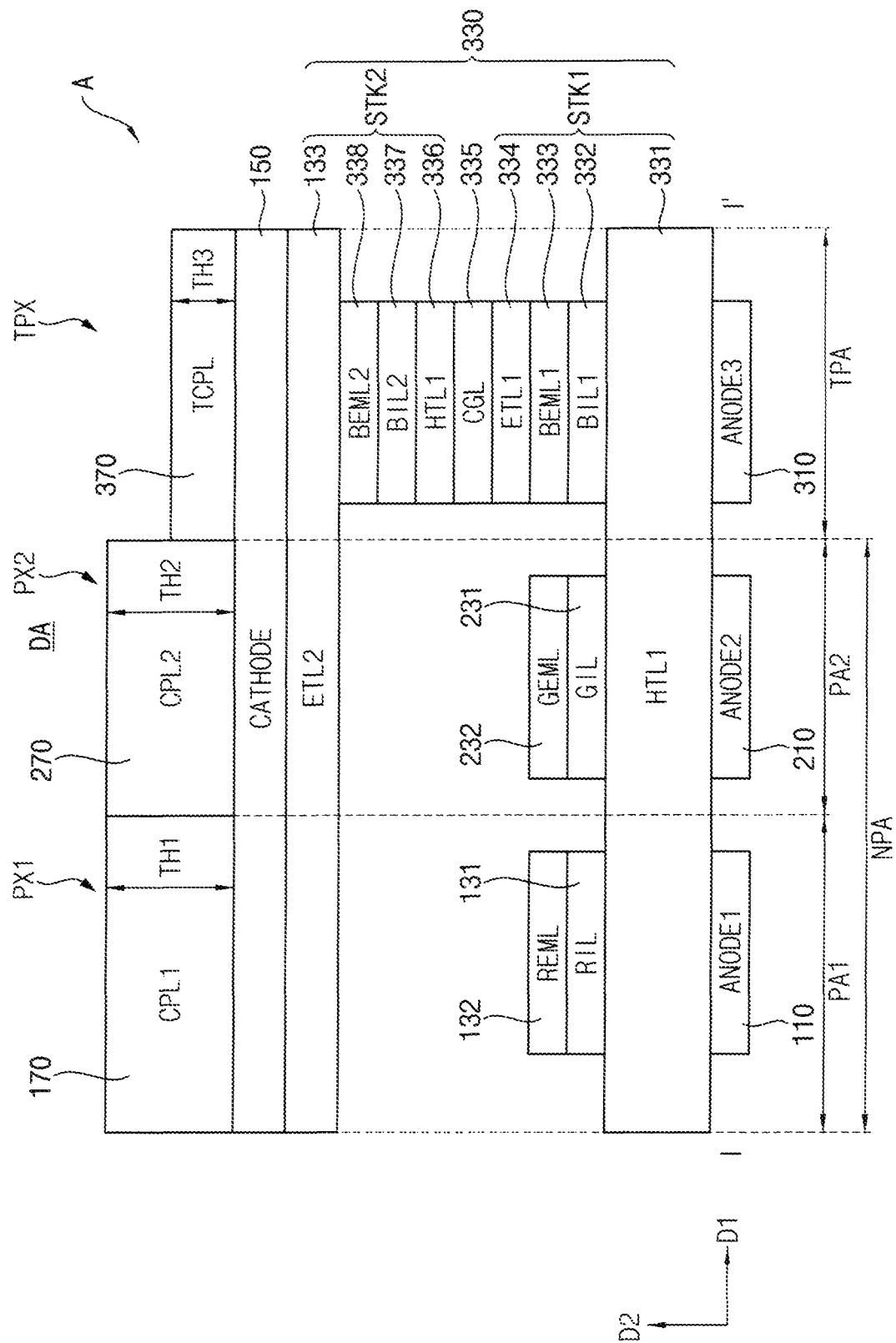

FIG. 3 and FIG. 4 are cross-sectional views illustrating an embodiment of an area A of FIG. 2. FIG. 3 and FIG. 4 may be cross-sectional views illustrating a first emitting diode PX1, a second emitting diode PX2, a tandem emitting diode TPX, a first capping layer 170, a second capping layer 270 and a tandem capping layer 370 included in the display device 11 of FIG. 2.

Referring to FIGS. 2, 3 and 4, the first pixel electrode 110 (ANODE1) may be disposed on the via insulating layer VIA and may overlap the first pixel area PA1. The first pixel electrode 110 may contact the first drain electrode DE1 and may receive the electrical driving current. In an embodiment, the first pixel electrode 110 may include a metal, an alloy, a metal oxide, a reflective conductive material or the like. In an embodiment, for example, the first pixel electrode 110 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO") or the like. In an embodiment, the first pixel electrode 110 may have an ITO/Ag/ITO structure.

The second pixel electrode 210 (ANODE2) may be disposed on the via insulating layer VIA and may overlap the second pixel area PA2. The tandem pixel electrode 310 (ANODE3) may be disposed on the via insulating layer VIA and may overlap the tandem pixel area TPA. The second pixel electrode 210 and the tandem pixel electrode 310 may include the same material as the first pixel electrode 110.

The pixel defining layer PDL may be disposed on the via insulating layer VIA and may define boundaries of the various pixel areas in a direction along the substrate SUB. In addition, the pixel defining layer PDL may include or define openings which expose upper surfaces of the pixel electrodes, and the emission layers may be disposed in or extend into the openings of the pixel defining layer PDL. In detail, the pixel defining layer PDL may include a first opening which exposes an upper surface of the first pixel electrode 110, and the first emission layer 130 may be disposed in the first opening. In addition, the pixel defining layer PDL may include a second opening which exposes an upper surface of the second pixel electrode 210, and the second emission layer 230 may be disposed in the second opening. In addition, the pixel defining layer PDL may include a third opening which exposes an upper surface of the tandem pixel electrode 310, and the tandem emission layer 330 may be disposed in the third opening.

The first emission layer 130 may be disposed on the first pixel electrode 110 and may overlap the first pixel area PA1. The first emission layer 130 may include a first portion of a first hole transfer layer 331 (HTL1), a first auxiliary layer 131 (RIL), a first organic light emitting layer 132 (REML), and a first portion of a second electron transfer layer 133 (ETL2).

The second emission layer 230 may be disposed on the second pixel electrode 210 and may overlap the second pixel area PA2. The second emission layer 230 may include a second portion of the first hole transfer layer 331, a second auxiliary layer 231 (GIL), a second organic light emitting layer 232 (GEML), and a second portion of the second electron transfer layer 133.

The tandem emission layer 330 may be disposed on the tandem pixel electrode 310 and may overlap the tandem pixel area TPA. The tandem emission layer 330 may include a third portion of the first hole transfer layer 331, a first tandem auxiliary layer 332 (BIL1), a first tandem organic light emitting layer 333 (BEML1), a first electron transfer layer 334 (ETL1), a charge generation layer 335 (CGL), a second hole transfer layer 336 (HTL1), a second tandem auxiliary layer 337 (BIL2), a second tandem organic light emitting layer 338 (BEML2), and a third portion of the second electron transfer layer 133.

The first hole transfer layer 331 may be disposed on the first pixel electrode 110, the second pixel electrode 210 and the tandem pixel electrode 310, and may overlap each of the normal pixel area NPA and the tandem pixel area TPA. In other words, the first hole transfer layer 331 may be commonly provided or formed in the display area DA. The first hole transfer layer 331 may increase the mobility of holes toward the first organic light emitting layer 132. In an embodiment, the first hole transfer layer 331 may include a hole transfer material. In an embodiment, for example, the first hole transfer layer 331 may include at least one of HATCN (1,4,5,8,9,11-hexaazatriphenylene-hexanitrile), CuPc (cupper phthalocyanine), PEDOT (poly(3,4)-ethylene-dioxythiophene), PAM (polyaniline) and NPD (N,N-dinaphthyl-N,N'-diphenylbenzidine.

The first auxiliary layer 131 may be disposed on the first hole transfer layer 331 and may overlap the first pixel area PA1. The first auxiliary layer 131 may enhance resonance of light emitted from the first organic light emitting layer 132. In an embodiment, the first auxiliary layer 131 may include an amine-based organic compound, and the resonance may be reinforced by adjusting the thickness of the first auxiliary layer 131. In an embodiment, the first auxiliary layer 131 may include a metal having high reflectivity, such as Ag and MgAg, and a material for adjusting an optical path, such as SiNx, SiOx, TiO2, Ta2O5, ITO and IZO.

The first organic light emitting layer 132 may be disposed on the first auxiliary layer 131 and may overlap the first pixel area PA1. When electrons and holes are injected into the first organic light emitting layer 132, the first organic light emitting layer 132 may emit light having the first color. In an embodiment, for example, the first color may be red, and the first organic light emitting layer 132 may include an organic material which emits red light.

The second auxiliary layer 231 may be disposed on the first hole transfer layer 331 and may overlap the second pixel area PA2. The second auxiliary layer 231 may enhance resonance of light emitted from the second organic light emitting layer 232. In an embodiment, the second auxiliary layer 231 may include an amine-based organic compound, and the resonance may be reinforced by adjusting the thickness of the second auxiliary layer 231. In an embodiment, the second auxiliary layer 231 may include a metal having high reflectivity such as Ag and MgAg, and a material for adjusting an optical path such as SiNx, SiOx, TiO2, Ta2O5, ITO, IZO and the like.

The second organic light emitting layer 232 may be disposed on the second auxiliary layer 231 and may overlap the second pixel area PA2. When electrons and holes are injected into the second organic light emitting layer 232, the second organic light emitting layer 232 may emit light having the second color. In an embodiment, for example, the second color may be green, and the second organic light emitting layer 232 may include an organic material which emits green light.

The first tandem auxiliary layer 332 may be disposed on the first hole transfer layer 331 and may overlap the tandem pixel area TPA. The first tandem auxiliary layer 332 may enhance resonance of light emitted from the first tandem organic light emitting layer 333. In an embodiment, the first tandem auxiliary layer 332 may include an amine-based organic compound, and the resonance may be reinforced by adjusting the thickness of the first tandem auxiliary layer 332. In an embodiment, the first tandem auxiliary layer 332 may include a metal having high reflectivity, such as Ag and MgAg, and a material for adjusting an optical path, such as SiNx, SiOx, TiO2, Ta2O5, ITO and IZO.

The first tandem organic light emitting layer 333 may be disposed on the first tandem auxiliary layer 332 and may overlap the tandem pixel area TPA. When electrons and holes are injected into the first tandem organic light emitting layer 333, the first tandem organic light emitting layer 333 may emit light having the third color. In an embodiment, example, the third color may be blue, and the first tandem organic light emitting layer 333 may include an organic material which emits blue light.

However, the first to third colors are not limited to those described above. In an embodiment, for example, the first color described above may be green, the second color described above may be blue, and the third color described above may be red.

The first electron transfer layer 334 may be disposed on the first tandem organic light emitting layer 333 and may overlap the tandem pixel area TPA. In an embodiment, the first electron transfer layer 334 may not overlap the normal pixel area NPA. As being disposed to not overlap a component or area, an element may be excluded from and/or spaced apart from the component or area. The first electron transfer layer 334 may increase mobility of electrons toward the first tandem organic light emitting layer 333. In an embodiment, the first electron transfer layer 334 may include an electron transfer material. In an embodiment, for example, the first electron transfer layer 334 may include at least one of 8-hydroxyquinolinolato-lithium (LiQ), Alq3 (tris(8-hydroxyquinolino)aluminum), PBD(2-(4-biphenylyl)-5-(4-tert-butylpheny)-1,3,4oxadiazole), TAZ and spiro-PBD.

The charge generation layer 335 may be disposed on the first electron transfer layer 334 and may overlap the tandem pixel area TPA. In an embodiment, the charge generation layer 335 may not overlap the normal pixel area NPA. The charge generation layer 335 may increase mobility of electrons toward the first tandem organic light emitting layer 333 and may increase mobility of holes toward the second tandem organic light emitting layer 338. In an embodiment, the charge generation layer 335 may include an n-type charge generation layer disposed on the first electron transfer layer 334 and a p-type charge generation layer disposed on the n-type charge generation layer and may have an NP junction structure.

The second hole transfer layer 336 may be disposed on the charge generation layer 335 and may overlap the tandem pixel area TPA. In an embodiment, the second hole transfer layer 336 may not overlap the normal pixel area NPA. The second hole transfer layer 336 may increase mobility of holes toward the second tandem organic light emitting layer 338. In an embodiment, the second hole transfer layer 336 may include a hole transfer material. In an embodiment, for example, the second hole transfer layer 336 may include at least one of HATCN (1,4,5,8,9,11-hexaazatriphenylenehexanitrile), CuPc (cupper phthalocyanine), PEDOT (poly (3,4)-ethylenedioxythiophene), polyaniline (PANI), and N,N-dinaphthyl-N,N'-diphenylbenzidine ("NPD").

The second tandem auxiliary layer 337 may be disposed on the second hole transfer layer 336 and may overlap the tandem pixel area TPA. The second tandem auxiliary layer 337 may enhance resonance of light emitted from the second tandem organic light emitting layer 338. In an embodiment, the second tandem auxiliary layer 337 may include an amine-based organic compound, and the resonance may be reinforced by adjusting the thickness of the second tandem auxiliary layer 337. In an embodiment, the second tandem auxiliary layer 337 may include a metal having high reflectivity such as Ag and MgAg, and a material for adjusting an optical path such as SiNx, SiOx, TiO2, Ta2O5, ITO, IZO and the like.

The second tandem organic light emitting layer 338 may be disposed on the second tandem auxiliary layer 337 and may overlap the tandem pixel area TPA. When electrons and holes are injected into the second tandem organic light emitting layer 338, the second tandem organic light emitting layer 338 may emit light having the third color. In an embodiment, for example, the third color may be blue, and the second tandem organic light emitting layer 338 may include an organic material which emits blue light.

The second electron transfer layer 133 may be disposed on the first organic light emitting layer 132, the second organic light emitting layer 232 and the second tandem organic light emitting layer 338, and may overlap both the normal pixel area NPA and the tandem pixel area TPA. In other words, the second electron transfer layer 133 may be commonly provided or formed in the display area DA. The second electron transfer layer 133 may increase mobility of electrons toward the first organic light emitting layer 132, the second organic light emitting layer 232 and the second tandem organic light emitting layer 338. In an embodiment, the second electron transfer layer 133 may include an electron transfer material. In an embodiment, for example, the second electron transfer layer 133 may include at least one of 8-Hydroxyquinolinolato-lithium (LiQ), Alq3 (tris(8- hydroxyquinolino)aluminum), PBD(2-(4-biphenylyl)-5-(4-tert-butylpheny)-1,3,4oxadiazole), TAZ, and spiro-PBD.

In an embodiment, the tandem emitting diode TPX may have a two-stack structure (e.g., tandem structure). Referring to FIG. 4, for example, the third portion of the first hole transfer layer 331, the first tandem auxiliary layer 332, the first tandem organic light emitting layer 333 and the first electron transfer layer 334 may constitute a first stack structure STK1. The second hole transfer layer 336, the second tandem auxiliary layer 337, the second tandem organic light emitting layer 338 and the third portion of the second electron transfer layer 133 may constitute a second stack structure STK2. As the tandem emitting diode TPX has the two-stack structure, electrical current efficiency of the tandem emitting diode TPX may be improved.

In an embodiment, for example, the first emitting diode PX1 (or the second emitting diode PX2) may have a one-stack structure together with the tandem emitting diode TPX which has the two-stack structure.

The common electrode 150 (CATHODE) may be disposed on the second electron transfer layer 133 and may overlap both the normal pixel area NPA and the tandem pixel area TPA. The common electrode 150 may include a metal, an alloy, a metal oxide, a transparent conductive material or the like. In an embodiment, for example, the common electrode 150 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO") and the like.

The first capping layer 170 (CPL1) may be disposed on the common electrode 150 and may overlap the first pixel area PA1. By using the refractive index of the first capping layer 170, light emitted from the first organic light emitting layer 132 may be resonated, and light extraction efficiency of the first emitting diode PX1 may be improved. In an embodiment, for example, the first capping layer 170 may include an organic material. In addition, the first capping layer 170 may have a constant thickness across an entirety of the first pixel area PA1 and may be disposed along a profile of the common electrode 150.

The second capping layer 270 (CPL2) may be disposed on the common electrode 150 and may overlap the second pixel area PA2. By using the refractive index of the second capping layer 270, light emitted from the second organic light emitting layer 232 may be resonated, and light extraction efficiency of the second emitting diode PX2 may be improved. In an embodiment, for example, the second capping layer 270 may include an organic material. In addition, the second capping layer 270 may have a constant thickness across an entirety of the second pixel area PA2 and may be disposed along a profile of the common electrode 150.

The tandem capping layer 370 (TCPL) may be disposed on the common electrode 150 and may overlap the tandem pixel area TPA. By using the refractive index of the tandem capping layer 370, the light emitted from the first tandem organic light emitting layer 333 and the second tandem organic light emitting layer 338 may be resonated, and light extraction efficiency of the tandem emitting diode TPX may be improved. In an embodiment, for example, the tandem capping layer 370 may include an organic material. In addition, the tandem capping layer 370 may have a constant thickness across an entirety of the tandem pixel area TPA and may be disposed along the profile of the common electrode 150.

The first capping layer 170 may have a first thickness TH1 along a second direction D2 which crosses the first direction D1. The second capping layer 270 may have a second thickness TH2 along the second direction D2. The tandem capping layer 370 may have a third thickness TH3 along the second direction D2. In an embodiment, the first thickness TH1 and the second thickness TH2 may be the same, and the third thickness TH3 may be smaller than the first thickness TH1. The first capping layer 170, the second capping layer 270 and the tandem capping layer 370 may be respective portions of a capping layer of the display device 11. The first capping layer 170, the second capping layer 270 and the tandem capping layer 370 may be respective portions of a same material layer on the substrate SUB which defines the capping layer of the display device 11.

As described above, the first emitting diode PX1 (or the second emitting diode PX2) may have the one-stack structure together with the tandem emitting diode TPX having the two-stack structure. Accordingly, a resonance deviation may occur between the degree of resonance of the light emitted from the first emitting diode PX1 (or the second emitting diode PX2) and the degree of resonance of the light emitted from the tandem emitting diode TPX. However, since the tandem capping layer 370 is provided or formed so that the third thickness TH3 is smaller than the first thickness TH1 (or the second thickness TH2), the resonance deviation may be reduced. Among various pixel areas, a number of stacks within a respective emitting diode of a respective pixel area may be inverse to a respective thickness of a capping layer in the respective pixel area. In other words, in order to reduce the resonance deviation, thicknesses of the various capping layers included in the display device 11 may be differentially adjusted. As the resonance deviation decreases, a color change amount for each angle of the tandem emitting diode TPX may be reduced, and a white angular dependency ("WAD") of the display device 11 may be improved. In other words, as the resonance deviation decreases, when the display device 11 is viewed from the side, a color shift phenomenon at the side viewing angle may be improved.

Figure 5:
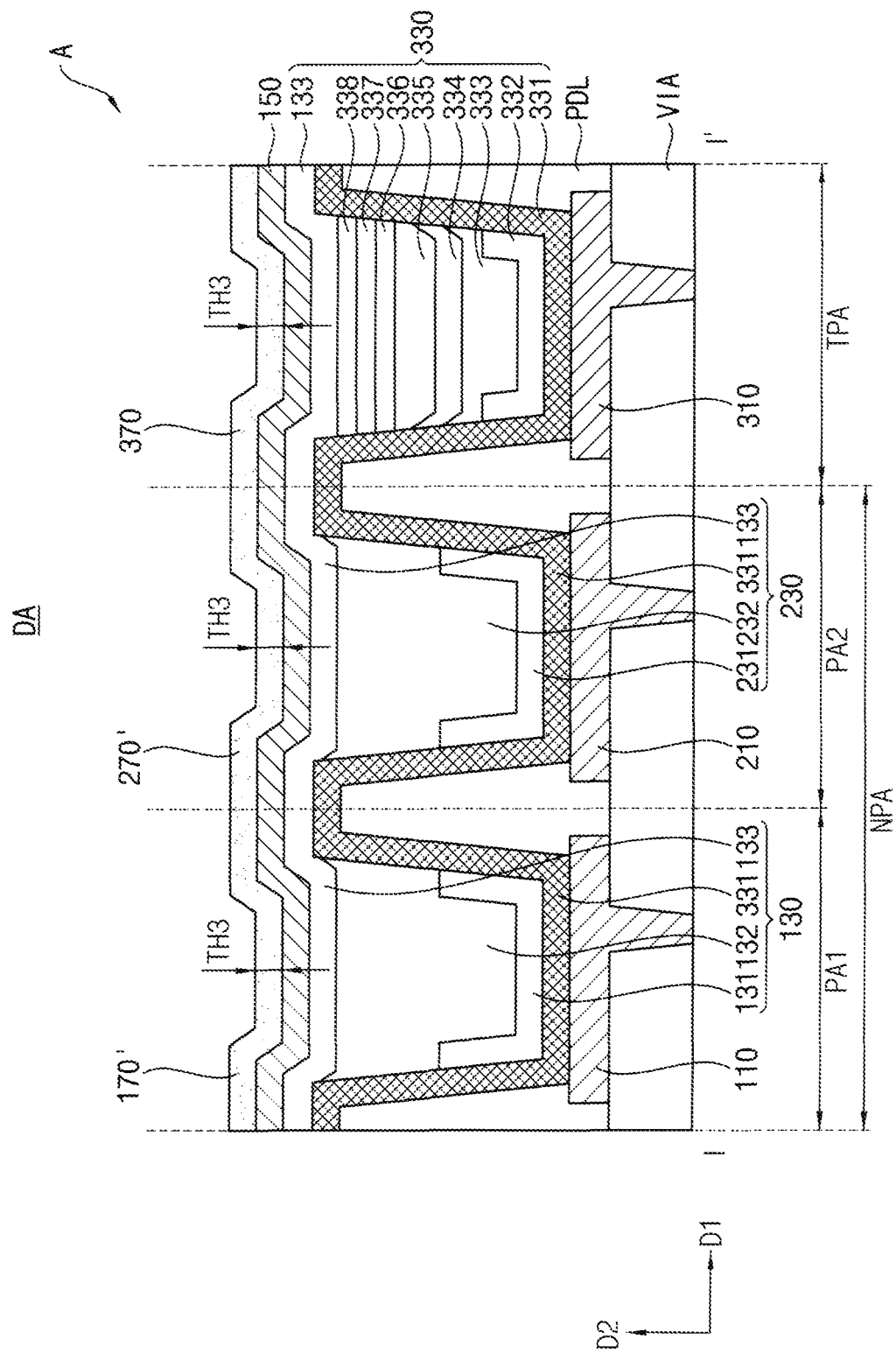
FIG. 5 and FIG. 6 are cross-sectional views illustrating an embodiment of a method of manufacturing a display device of FIG. 3.
Figure 6:
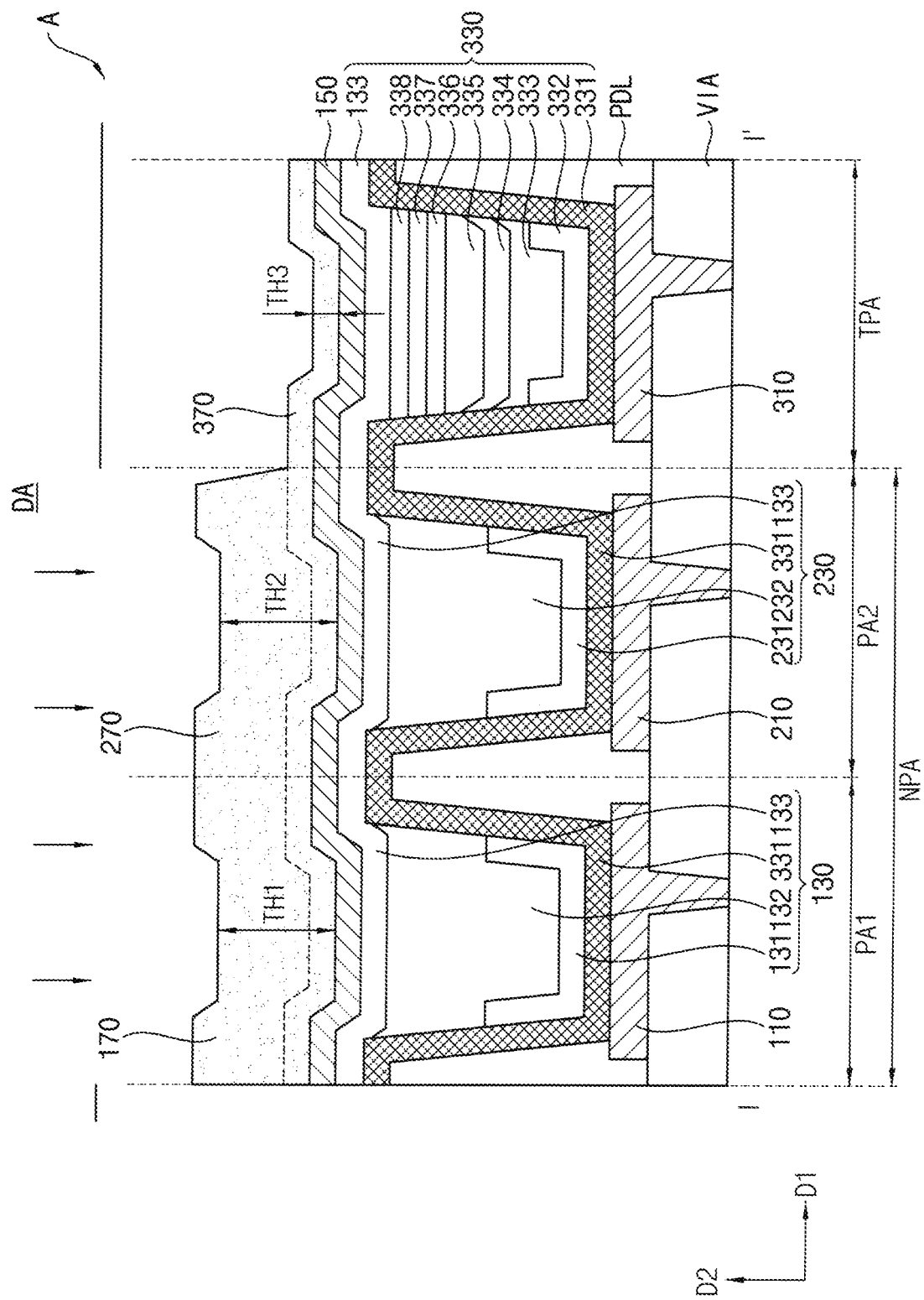

FIG. 5 and FIG. 6 are cross-sectional views illustrating an embodiment of a method of manufacturing a display device 11 of FIG. 3.

Referring to FIGS. 3 and 5, through holes penetrating the via insulating layer VIA may be provided or formed, and the first pixel electrode 110, the second pixel electrode 210 and the tandem pixel electrode 310 may be provided or formed together (e.g., at a same time, in a same process, as respective patterns of a same material layer, etc.). Accordingly, the first pixel electrode 110, the second pixel electrode 210 and the tandem pixel electrode 310 may include the same material.

In addition, a pixel defining layer PDL exposing upper surfaces of the pixel electrodes may be provided or formed, and the first hole transfer layer 331 may be provided or formed as a whole in the display area DA. In an embodiment, for example, the first hole transfer layer 331 may be deposited using an open mask.

In addition, the first auxiliary layer 131 and the first organic light emitting layer 132 may be provided or formed to overlap the first pixel area PA1, the second auxiliary layer 231 and the second organic light emitting layer 232 may be provided or formed to overlap the second pixel area PA2, and the first tandem auxiliary layer 332, the first tandem organic light emitting layer 333, the first electron transfer layer 334, the charge generation layer 335, the second hole transfer layer 336, the second tandem auxiliary layer 337 and the second tandem organic light emitting layer 338 may be provided or formed in order to overlap the tandem pixel area TPA. In addition, the second electron transfer layer 133 and the common electrode 150 may formed as a whole in the display area DA.

In an embodiment, a first preliminary capping layer 170', a second preliminary capping layer 270' and the tandem capping layer 370 may be provided or formed together. In an embodiment, for example, the preliminary first capping layer 170', the preliminary second capping layer 270' and the tandem capping layer 370 may be provided using an open mask having an opening corresponding to the display area DA. Accordingly, the first preliminary capping layer 170', the second preliminary capping layer 270' and the tandem capping layer 370 may have the same thickness as the third thickness TH3. The third thickness TH3 may be preliminary thickness for the first preliminary capping layer 170' and the second preliminary capping layer 270'.

Referring to FIGS. 3 and 6, the first capping layer 170 and the second capping layer 270 may be provided or formed together. In an embodiment, for example, the first capping layer 170 and the second capping layer 270 may be provided (refer to downward arrows in FIG. 6) using a fine metal mask ("FMM") having an opening corresponding to the normal pixel area NPA (e.g., mask indicated by horizontal line disconnected at the normal pixel area NPA in FIG. 6). Accordingly, the first capping layer 170 and the second capping layer 270 may have a final thickness of the first thickness TH1 (or the second thickness TH2) which is greater than the third thickness TH3 and includes the preliminary thickness of the third thickness TH3. In addition, the first capping layer 170 and the second capping layer 270 may have the same thickness (e.g., the first thickness TH1 or the second thickness TH2).

Figure 7:
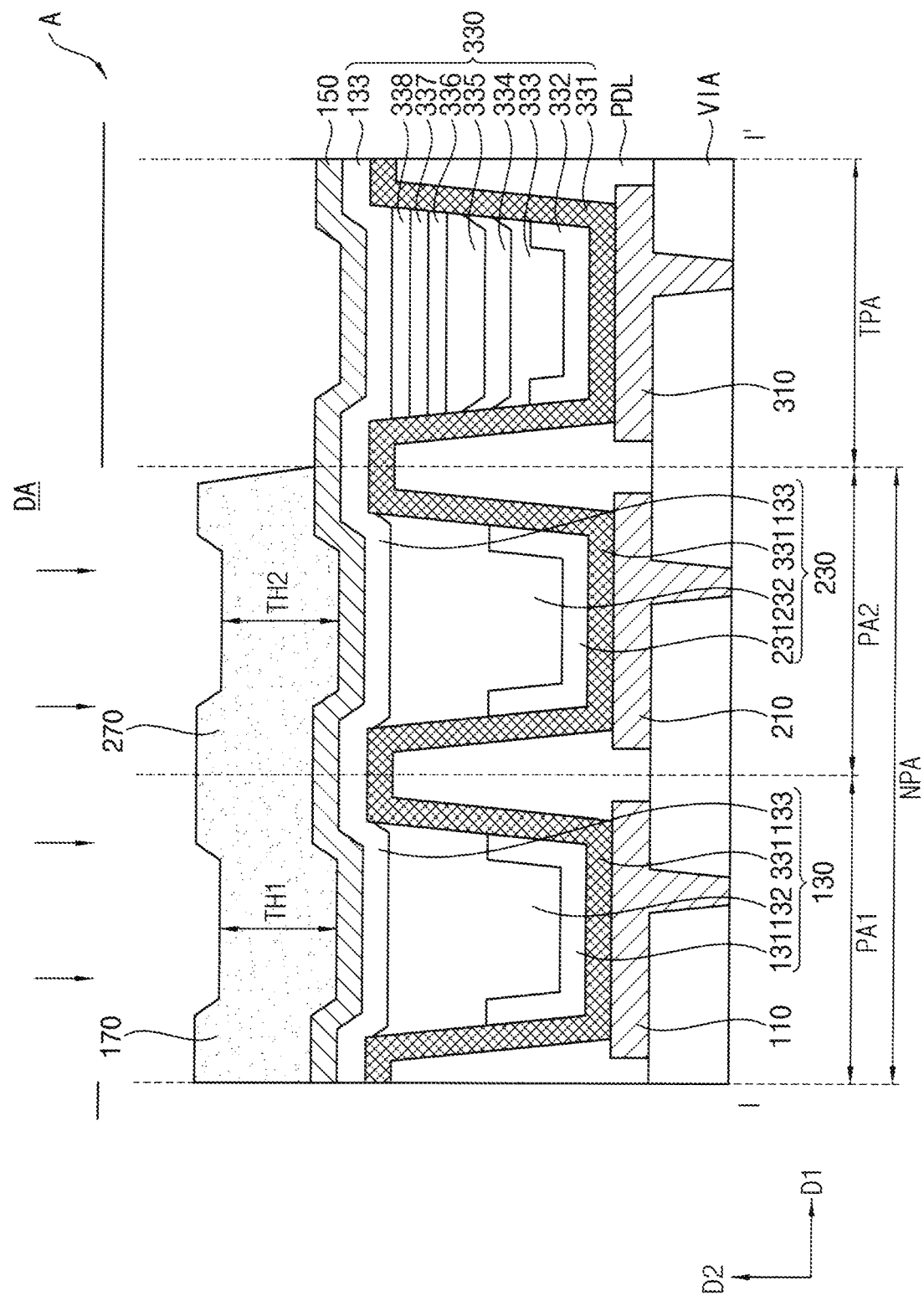
FIG. 7 and FIG. 8 are cross-sectional views illustrating an embodiment of a method of manufacturing a display device of FIG. 3.
Figure 8:
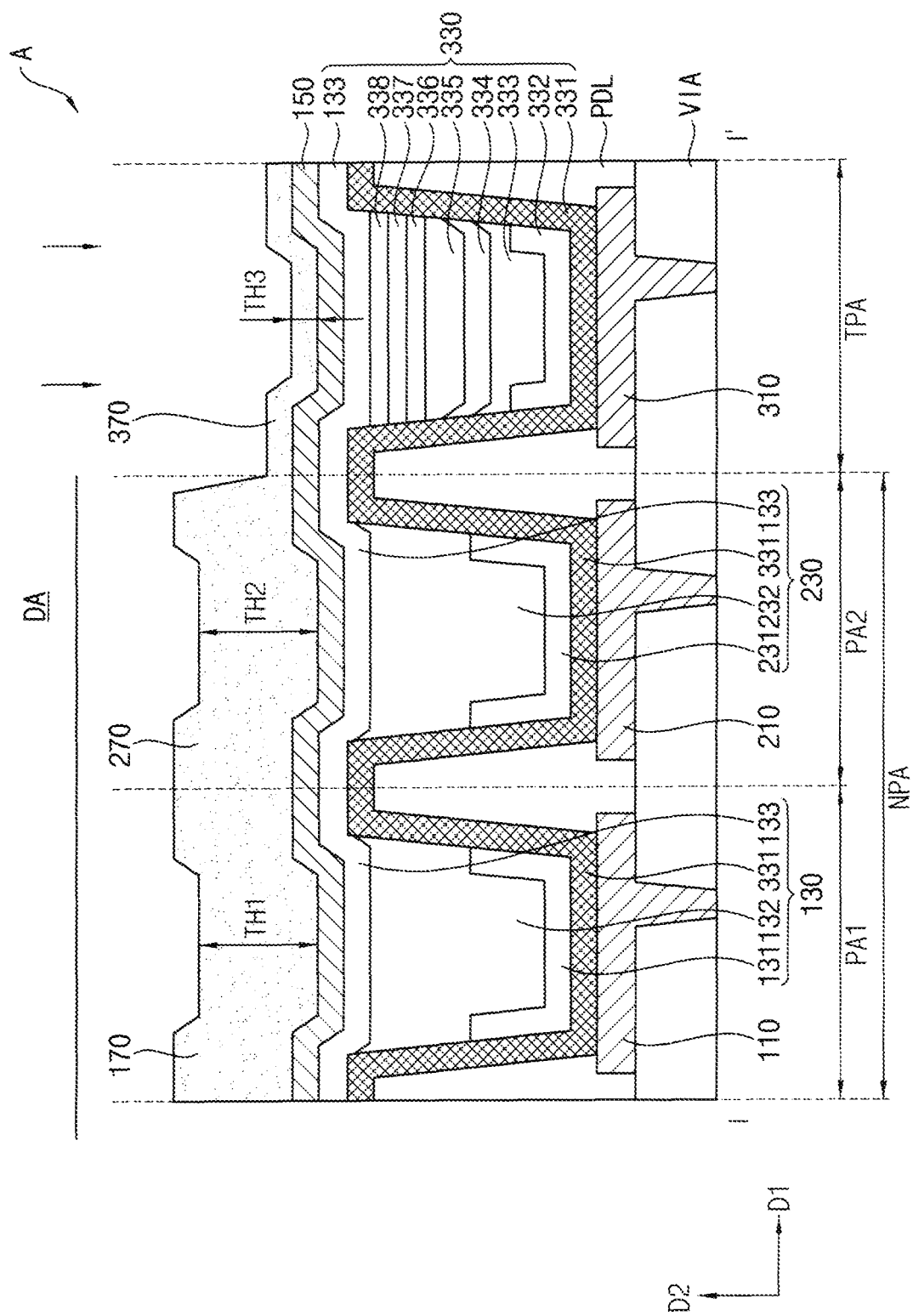

FIG. 7 and FIG. 8 are cross-sectional views illustrating an embodiment of a method of manufacturing a display device 11 of FIG. 3.

Referring to FIGS. 3 and 7, the common electrode 150 may be provided or formed as a whole in the display area DA. In an embodiment, for example, the method of manufacturing the components disposed under the common electrode 150 may be substantially the same as described with reference to FIG. 5.

In an embodiment, the first capping layer 170 and the second capping layer 270 may be provided or formed together. In an embodiment, for example, the first capping layer 170 and the second capping layer 270 may be deposited using an open mask (or fine metal mask) having an opening corresponding to the normal pixel area NPA (e.g., mask indicated by horizontal line disconnected at the normal pixel area NPA in FIG. 7). Accordingly, the first capping layer 170 and the second capping layer 270 may have the same first thickness TH1 (or the second thickness TH2).

Referring to FIGS. 3 and 8, the tandem capping layer 370 may be provided or formed. In an embodiment, for example, the tandem capping layer 370 may be deposited using a fine metal mask having an opening corresponding to the tandem pixel area TPA (e.g., mask indicated by horizontal line disconnected at the tandem pixel area TPA in FIG. 8). Accordingly, the tandem capping layer 370 may have the third thickness TH3 smaller than the first thickness TH1. That is, an entirety of different thicknesses of the various capping layers are provided separately or in separate mask processes.

Figure 9:
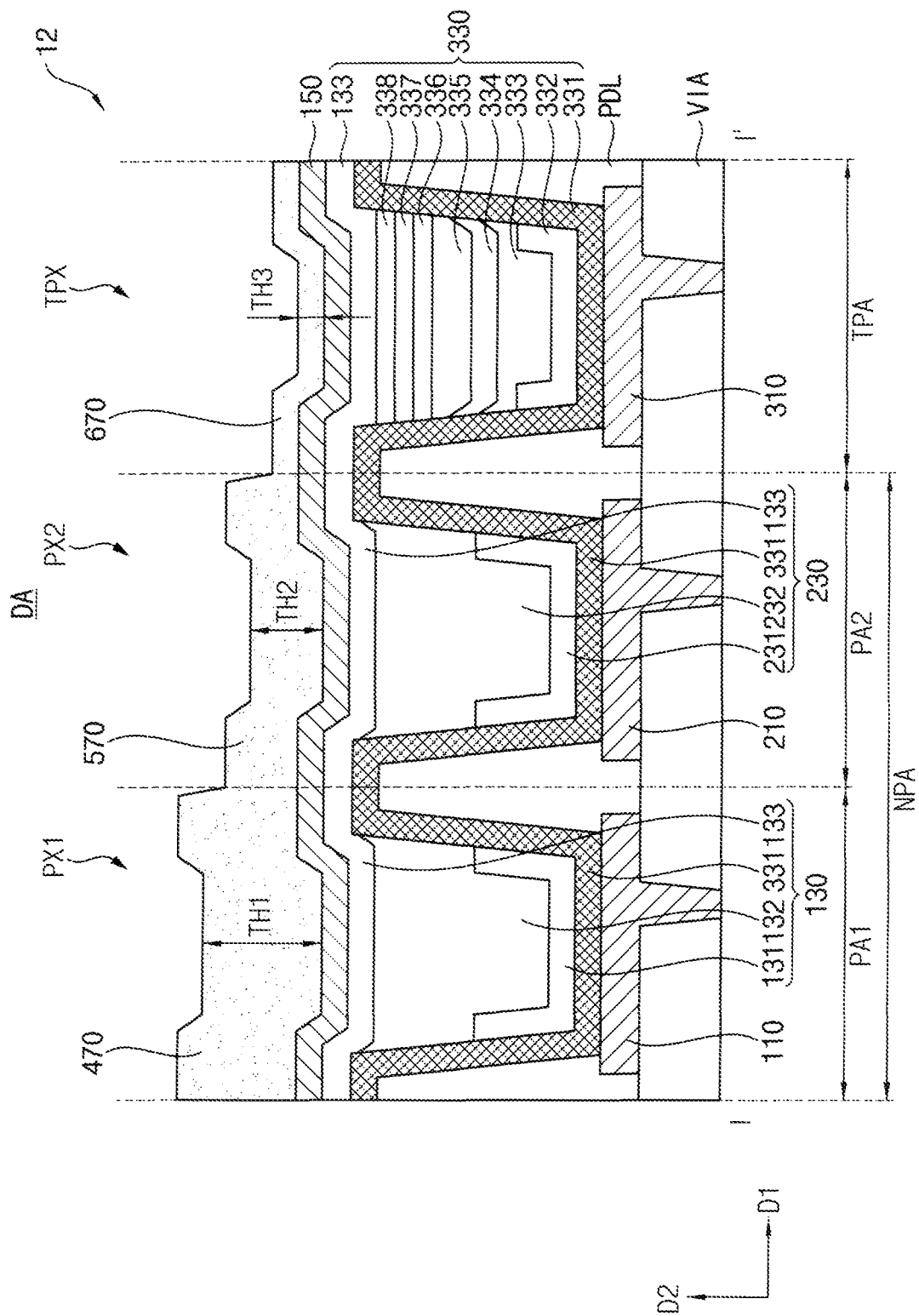

FIG. 9 and FIG. 10 are cross-sectional views illustrating an embodiment of a display device 12.

Referring to FIGS. 2, 9, and 10, since a display device 12 is substantially the same as the display device 11 except for a first capping layer 470, a second capping layer 570 and a tandem capping layer 670, a duplicate description will be omitted.

The first capping layer 470 may be disposed on the common electrode 150 and may overlap the first pixel area PM. By using the refractive index of the first capping layer 470, light emitted from the first organic light emitting layer 132 may be resonated, and light extraction efficiency of the first emitting diode PX1 may be improved. In an embodiment, for example, the first capping layer 470 may include an organic material. In addition, the first capping layer 470 may have a constant thickness and may be disposed along a profile of the common electrode 150.

The second capping layer 570 may be disposed on the common electrode 150 and may overlap the second pixel area PA2. By using the refractive index of the second capping layer 570, light emitted from the second organic light emitting layer 232 may be resonated, and light extraction efficiency of the second emitting diode PX2 may be improved. In an embodiment, for example, the second capping layer 570 may include an organic material. In addition, the second capping layer 570 may have a constant thickness and may be disposed along a profile of the common electrode 150.

The tandem capping layer 670 may be disposed on the common electrode 150 and may overlap the tandem pixel area TPA. By using the refractive index of the tandem capping layer 670, the light emitted from the first tandem organic light emitting layer 333 and the second tandem organic light emitting layer 338 may be resonated, and light extraction efficiency of the tandem emitting diode TPX may be improved. In an embodiment, for example, the tandem capping layer 670 may include an organic material. In addition, the tandem capping layer 670 may have a constant thickness and may be disposed along the profile of the common electrode 150.

The first capping layer 470 may have a first thickness TH1 along the second direction D2. The second capping layer 570 may have a second thickness TH2 along the second direction D2. The tandem capping layer 670 may have a third thickness TH3 along the second direction D2. In an embodiment, the first thickness TH1, the second thickness TH2 and the third thickness TH3 may be different from each other. The first thickness TH1, the second thickness TH2 and the third thickness TH3 may be appropriately set based on the first color, the second color and the third color of emitted light of a respective pixel area. In an embodiment, for example, the third thickness TH3 may be smaller than the second thickness TH2, and the second thickness TH2 may be smaller than the first thickness TH1.

Although embodiments and implementations have been described herein, other embodiments and modifications will be apparent from this description. Accordingly, the disclosure is not limited to such embodiments, but rather to the broader scope of the appended claims and various obvious modifications and equivalent arrangements as would be apparent to a person of ordinary skill in the art.

What is claimed is:

1. A display device comprising:
 a plurality of pixel areas each having a stack structure including a number of stacks defined by a number of organic light emitting layers within the stack structure, the plurality of pixel areas including a first pixel area, a tandem pixel area adjacent to the first pixel area, and
a second pixel area which is between the first pixel area and the tandem pixel area;
in the first pixel area:
a first pixel electrode;
a first organic light emitting layer which emits light having a first color; and
the stack structure of the first pixel area having one stack including the first organic light emitting layer;
in the tandem pixel area:
a tandem pixel electrode in a same layer as the first pixel electrode;
a first tandem organic light emitting layer which emits light having a second color different from the first color;
a second tandem organic light emitting layer which faces the tandem pixel electrode with the first tandem organic light emitting layer therebetween and emits light having the second color; and
the stack structure of the tandem pixel area having two stacks as including a greater number of organic light emitting layers than the number of organic light emitting layers of the first pixel area, the two stacks including both the first tandem organic light emitting layer and the second tandem organic light emitting layer;
in the second pixel area:
a second pixel electrode in a same layer as the first pixel electrode and the tandem pixel electrode;
a second organic light emitting layer which emits light having a third color different from the first color and the second color; and
the stack structure of the second pixel area having one stack including the second organic light emitting layer, the one stack including a smaller number of organic light emitting layers than the number of organic light emitting layers of the tandem pixel area;
a capping layer including a thickness at the first pixel area, a thickness at the second pixel area and a thickness at the tandem pixel area;
a common electrode between the capping layer and the first organic light emitting layer, between the capping layer and the second organic light emitting layer and between the capping layer and the second tandem organic light emitting layer,
wherein the thickness of the capping layer at the tandem pixel area is smaller than the thickness of the capping layer at the first pixel area, and
wherein the thicknesses of the capping layer are respectively inverse to the number of stacks of the first pixel area, the tandem pixel area and the second pixel area.

2. The display device of claim 1, wherein
the capping layer includes:
in the first pixel area, a first capping layer corresponding to the first organic light emitting layer, and
in the tandem pixel area, a tandem capping layer corresponding to both the first tandem organic light emitting layer and the second tandem organic light emitting layer; and
the first capping layer and the tandem capping layer include a same material.

3. The display device of claim 2, wherein the first capping layer and the tandem capping layer include an organic material.

4. The display device of claim 1, further comprising:
a first hole transfer layer between the first pixel electrode and the first tandem organic light emitting layer and between the tandem pixel electrode and the first tandem organic light emitting layer; and
in the tandem pixel area, a second hole transfer layer between the first tandem organic light emitting layer and the second tandem organic light emitting layer.

5. The display device of claim 4, further comprising:
in the tandem pixel area, a first electron transfer layer between the first tandem organic light emitting layer and the second hole transfer layer; and
a second electron transfer layer between the second tandem organic light emitting layer and the common electrode and between the first organic light emitting layer and the common electrode.

6. The display device of claim 5, further comprising in the tandem pixel area a charge generation layer between the first electron transfer layer and the second hole transfer layer.

7. The display device of claim 6, wherein the second hole transfer layer, the first electron transfer layer and the charge generation layer of the tandem pixel area are spaced apart from the first pixel area.

8. The display device of claim 1, further comprising an encapsulation layer in each of the first pixel area and the tandem pixel area,
wherein the encapsulation layer comprises in order from the capping layer a first inorganic film, an organic film, and a second inorganic film.

9. The display device of claim 8, wherein the first inorganic film and the second inorganic film include silicon oxide, silicon nitride or silicon oxynitride.

10. The display device of claim 1, wherein the thickness of the capping layer at the first pixel area is the same as the thickness of the capping layer at the second pixel area.

11. The display device of claim 1, wherein the thickness of the capping layer at the first pixel area, the thickness of the capping layer at the tandem pixel area, and the thickness of the capping layer at the second pixel area are different from each other.

12. The display device of claim 1, wherein the thickness of the capping layer at the first pixel area and the thickness of the capping layer at the second pixel area are both greater than the thickness of the capping layer at the tandem pixel area.

13. The display device of claim 1, wherein the first color is red, the second color is blue and the third color is green.

14. A display device comprising:
a plurality of light emitting diodes each having a stack structure including a number of stacks defined by a number of organic light emitting layers within the stack structure, the plurality of light emitting diodes including a first light emitting diode, a tandem light emitting diode which is adjacent to the first light emitting diode, and a second light emitting diode which is between the first light emitting diode and the tandem light emitting diode; and
a capping layer which has a thickness at each of the first light emitting diode, the tandem light emitting diode, and the second light emitting diode,
wherein
the first light emitting diode comprises in order toward the capping layer a first pixel electrode, a first hole transfer layer, and a first organic light emitting layer, which define the stack structure of the first light emitting diode having one stack,
the tandem light emitting diode having two stacks as including a greater number of organic light emitting layers than the number of organic light emitting layers of the first light emitting diode, the two stacks comprising in order toward the capping layer a tandem pixel electrode, the first hole transfer layer, a first tandem organic light emitting layer, a first electron transfer layer, a second hole transfer layer, and a second tandem organic light emitting layer, the second light emitting diode comprises in order toward the capping layer, a second pixel electrode, the first hole transfer layer, and a second organic light emitting layer, which define the stack structure of the second light emitting diode having one stack as including a smaller number of organic light emitting layers than the number of organic light emitting layers of the tandem light emitting diode, the thickness of the capping layer corresponding to the tandem light emitting diode is smaller than the thickness of the capping layer corresponding to the first light emitting diode, and the thicknesses of the capping layer are respectively inverse to the number of stacks of the first light emitting diode, the second light emitting diode and the tandem light emitting diode.

15. The display device of claim 14,
within the display device a number of the first light emitting diode, a number of the second light emitting diode and a number of the tandem light emitting diode,
wherein within the display device the number of the first light emitting diode, the number of the second light emitting diode and the number of the tandem light emitting diode are the same.

16. The display device of claim 14, wherein the thickness of the capping layer corresponding to the first light emitting diode is the same as the thickness of the capping layer corresponding to the second light emitting diode.

17. The display device of claim 14, wherein the thickness of the capping layer corresponding to the first light emitting diode and the thickness of the capping layer corresponding to the second light emitting diode are different from each other.

18. The display device of claim 14, wherein within the tandem light emitting diode:
each of the first tandem organic light emitting layer and the second tandem organic light emitting layer emits light having a color, and
the first tandem organic light emitting layer emits light having a same color as the second tandem organic light emitting layer.

* * * * *